United States Patent [19]

Uchikoshi

[11] Patent Number: 4,542,371

[45] Date of Patent: Sep. 17, 1985

[54] METHOD OF CONVERTING A DIGITAL SIGNAL INTO AN ANALOG SIGNAL AND A CONVERTER THEREFOR

[75] Inventor: Gohji Uchikoshi, Higashimurayama, Japan

[73] Assignee: Nakamichi Corporation, Tokyo, Japan

[21] Appl. No.: 404,619

[22] Filed: Aug. 2, 1982

[30] Foreign Application Priority Data

Aug. 11, 1981 [JP] Japan ................................ 56-125486

[51] Int. Cl.$^4$ .......................................... H03K 13/02
[52] U.S. Cl. .......................... 340/347 DA; 328/162;
328/165; 329/106; 332/9 R; 332/37 R; 340/347
M; 340/347 CC; 375/22; 377/42
[58] Field of Search ............... 328/165, 162; 332/9 R,
332/37 R; 375/22; 329/102–106; 377/42

[56] References Cited

U.S. PATENT DOCUMENTS 4,266,201  5/1981  Belfatto ............................. 375/22 X Primary Examiner—T. J. Sloyan
Attorney, Agent, or Firm—Pearne, Gordon, Sessions, McCoy, Granger & Tilberry

[57] ABSTRACT

This invention relates to a method of converting a digital signal into an analog signal and a digital-to-analog converter therefor.

In the invention, a digital signal having varying pulse width values is converted into a first pulse width signal, with each pulse varying in its pulse width in response to its respective data values and with the center of each pulse width being at a fixed time position within a respective sampling period, while a complement of the digital signal is converted into a second pulse width signal with each pulse varying in its pulse width in response to its respective data value and relative to said center of each respective pulse width. The first and second pulse width signals, after one of them is inverted, are mixed and pass through a smoothing filter to demodulate the digital signal into the analog signal.

2 Claims, 4 Drawing Figures

METHOD OF CONVERTING A DIGITAL SIGNAL INTO AN ANALOG SIGNAL AND A CONVERTER THEREFOR

BACKGROUND OF THE INVENTION

In one prior art circuit of a digital-to-analog conversion, a digital signal is firstly converted into a pulse width signal varying in its pulse width in response to its digital data value, and thereafter it passes through a smoothing filter to be demodulated into an analog signal. According to the prior art, a high precision of conversion can be obtained without any component of high precision.

However, in the prior art, since the pulse width of the pulse width signal varies, with the leading edge of the pulse starting at a periodic sampling time, the center of the pulse width varies in accordance with the data value of the sampled digital data. Therefore, the waveform of the demodulated analog signal disadvantageously differs from the waveform of the original analog signal. The portion of the demodulated analog signal in which a level increases is extended in comparison to the corresponding portion of the original analog signal while a portion of the demodulated analog signal in which a level decreases is compressed in comparison to the corresponding portion of the original analog signal. This gives second harmonic distortion.

In order to solve a problem of distortion, as shown in FIG. 1, it will be considered that a digital signal is converted into a pulse width signal $P$ so that each of the pulses $P_a$, $P_b$, $P_c$—varies in its pulse width in response to each respective data value of a corresponding sampled digital data and with the center of each pulse width having a constant time interval $t_0$ from each sampling time $t_a$, $t_b$, $t_c$—responsive to a sampling signal having a repetitive sampling period $T$. In this method, however, there will remain a distortion in the waveform of the demodulated analog signal as described later. In FIG. 2A, provided that sampling times are $t_1$ through $t_8$ when an original analog signal $S$ is sampled by the sampling signal having a frequency eight times that of the sine-wave signal, analog data sampled at each sampling time $t_1$ through $t_8$ is converted into corresponding digital data by an analog-to-digital conversion. The aforementioned digital signal-to-pulse width signal conversion is executed when these digital data are demodulated into the analog signal by a digital-to-analog conversion. In FIG. 2B, the digital data having varying pulse width values are shown as a pulse width signal $P_x$ having the center of each pulse width at each sampling time $t'_1$ through $t'_8$. This, for example, could be that digital signal obtained from the playback of a digital tape on which has been recorded the digital signal after analog-to-digital conversion of the original analog signal $S$ shown in FIG. 2A. It will be considered that each pulse of the pulse width signal $P_x$ is a mixture of a pulse of a pulse width signal $P_y$ produced when the zero reference level of the original analog signal is sampled, and a pulse of a pulse width signal $P_z$ produced by converting digital data corresponding to each level difference between a zero reference level and an actual sampled level of the original analog signal $S$.

Thus, when the pulse width signal $P_x$ is smoothed through a filter, the component of the demodulated analog signal corresponding to the pulse width signal $P_y$ has no distortion, but the component corresponding to the pulse width signal $P_z$ has a distortion of second harmonic wave H as shown in dotted lines D of FIG. 2A because the positive and negative pulses adjacent to the top and bottom of the original analog waveform are not symmetrical to each other.

SUMMARY OF THE INVENTION

Accordingly, it is a principal object of the invention to provide a method of converting a digital signal into an analog signal adapted to have no second harmonic distortion.

It is another object of the invention to provide a method of converting a digital signal into an analog signal with high fidelity.

It is a further object of the invention to provide a digital-to-analog converter adapted to produce an analog signal having no second harmonic distortion.

In accordance with one aspect of the invention, there is provided a method of converting a digital signal into an analog signal comprising the steps of converting said sampled digital signal into a first pulse width signal varying in its pulse width in response to its data values relative to a center of pulse width which is a fixed time position within a sampling period, converting a complement of said sampled digital signal into a second pulse width signal varying in its pulse width in response to its data values relative to said center of pulse width, mixing said first and second pulse width signals with one of them being inverted to produce a composite signal, and passing said composite signal through a smoothing filter to demodulate said digital signal into said analog signal.

In accordance with another aspect of the invention, there is provided a digital-to-analog converter for converting a sampled digital signal into an analog signal comprising a first pulse width signal forming circuit to convert said sampled digital signal into a first pulse width varying in its pulse width in response to its data values relative to a center of pulse width which is a fixed time position within a sampling period, a complementing circuit to complement said sampled digital signal to produce a complementary signal therefrom, a second pulse width signal forming circuit to convert said complementary signal into a second pulse width signal varying in its pulse width in response to its data values relative to said center of pulse width, a mixer circuit to mix said first and second pulse width signals while one of them is inverted to produce a composite signal, and a filter circuit to smooth said composite signal to demodulate said digital signal into said analog signal.

BRIEF DESCRIPTION OF THE DRAWING

The above and other objects and features of the invention will be apparent from the description of the embodiment taken along with reference to the accompanying drawing in which.

DETAILED DESCRIPTION OF THE EMBODIMENT

Figure 1:
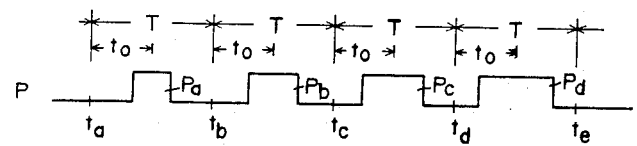
FIG. 1 illustrates a digital signal having varying pulse width values in accordance with the invention.
Figure 2A:
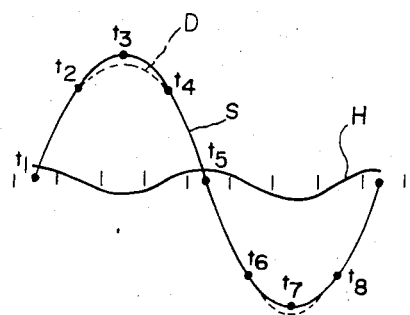
FIG. 2A illustrates a waveform of an original analog signal.
Figure 2B:
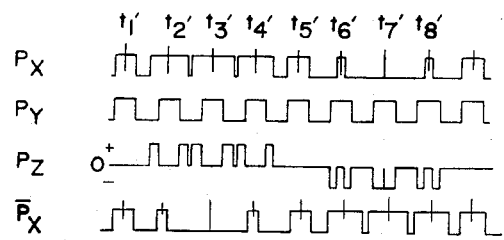
FIG. 2B illustrates pulse width signals produced by converting the original analog signal in FIG. 2A.
Figure 3:
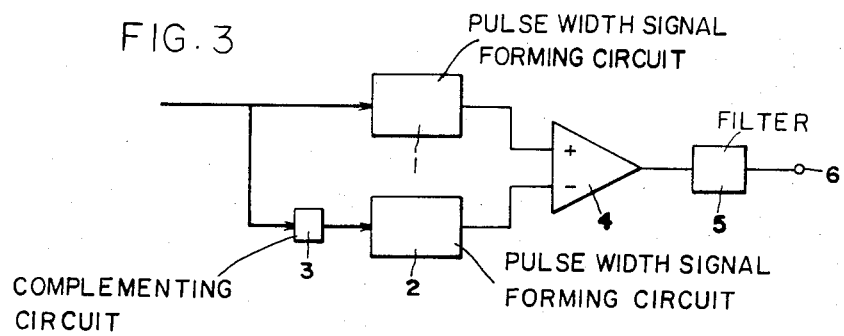
FIG. 3 is a schematic diagram of a digital-to-analog converter used for the invention.

In FIG. 3, a thick line shows a bundle of digital signal lines for a digital data input. The digital data input of predetermined bits is introduced into a first pulse width signal forming circuit 1 and also through a complementing circuit 3 into a second pulse width signal forming circuit 2. These circuits 1 and 2 may be of the type shown in U.S. Pat. No. 4,467,319, issued Aug. 21, 1984 and filed Mar. 22, 1982. In the first pulse width signal forming circuit 1, the digital data input series is sequentially converted into a first pulse width signal varying in each pulse width in response to each data value of the digital data input relative to the center of the pulse width which is at a fixed time position within a sampling period. The same digital data input is also complemented by the complementing circuit 3 into complementary digital data, which is in turn converted by the second pulse width signal forming circuit 2 into a second pulse width signal $\bar{P}_x$, shown in FIG. 2B, varying in its pulse width in response to the data values of the complementary digital data relative to the same center of pulse width as the first pulse width signal.

The first $P_x$ and second $\bar{P}_x$ pulse width signals are introduced into a mixer circuit 4. The mixer circuit 4 mixes the first and second pulse width signals while one of them is inverted, resulting in a composite signal. The composite signal is smoothed by a filter circuit 5. Thus, a demodulated analog signal is produced at an output terminal 6 of the filter circuit 5.

In the aforementioned digital-to-analog conversion system, a first demodulated analog signal processed through the first pulse width signal forming circuit 1 and the filter circuit 5, and corresponding to a filtered $P_x$ signal, is indicated by the expression "A sin$\omega$t + $\Delta$cos 2$\omega$t" in which "A sin $\omega$t" is a distortionless signal while "$\Delta$cos 2$\omega$t" is a second harmonic wave distortion. On the other hand, a second demodulated analog signal processed through the second pulse width signal forming circuit 2 and the filter circuit 5 can be indicated by the expression "$-$A sin$\omega$t + $\Delta$cos 2$\omega$t" in which "$-$A sin$\omega$t" is an inverted distortionless signal while "$\Delta$cos 2$\omega$t" is a second harmonic wave distortion which is produced in the same phase relative to the second harmonic wave distortion of the first signal.

Thus, $P_x - \bar{P}_x$ is the composite signal from the mixer 4, and after filtering, it will be noted that this composite signal from the output terminal 6 is indicated by the expression "(A sin$\omega$t + $\Delta$cos 2$\omega$t) $-$ ($-$A sin$\omega$t + $\Delta$cos 2$\omega$t) = 2A sin$\omega$t". The composite signal has no distortion because the two second harmonic wave distortions are offset.

Although one preferred embodiment of the invention has been illustrated and described with reference to the accompanying drawing, it will be understood by those skilled in the art that it is by way of example, and that various changes and modifications may be made without departing from the spirit and scope of the invention, which is intended to be defined only by the appended claims.

What is claimed is:

1. A method of converting a digital signal into an analog signal comprising the steps of:
   converting said digital signal into a first pulse width signal with each pulse varying in its pulse width in response to its respective data value and with the center of each pulse width being at a fixed time position within a repetitive sampling period;
   converting a complement of said digital signal into a second pulse width signal with each pulse varying in its pulse width in response to its respective data value and relative to said center of each respective pulse width;
   mixing said first and second pulse width signals with one of them being inverted to produce a composite signal;
   and passing said composite signal through a smoothing filter to demodulate said digital signal into an analog signal.

2. A digital-to-analog converter for converting a digital signal into an analog signal comprising:
   a first pulse width signal forming circuit to convert said digital signal into a first pulse width signal with each pulse varying in its pulse width in response to its respective data value and with the center of each pulse width being at a fixed time position within a repetitive sampling period;
   a complementing circuit to complement said sampled digital signal to produce a complementary signal therefrom;
   a second pulse width signal forming circuit to convert said complementary signal into a second pulse width signal with each pulse varying in its pulse width in response to its respective data value and relative to said center of each respective pulse width;
   a mixer circuit to mix said first and second pulse width signals while one of them is inverted to produce a composite signal;
   and a filter circuit to smooth said composite signal to demodulate said digital signal into said analog signal.

* * * * *